United States Patent [19]

Edwards et al.

[11] 4,239,983
[45] Dec. 16, 1980

[54] NON-DESTRUCTIVE CHARGE TRANSFER DEVICE DIFFERENCING CIRCUIT

[75] Inventors: Nathan P. Edwards, Darien, Conn.; James M. White, Charlotte, N.C.

[73] Assignee: International Business Machines Corporation, Armonk, N.Y.

[21] Appl. No.: 19,211

[22] Filed: Mar. 9, 1979

[51] Int. Cl.³ .................. G11C 19/28; H01L 29/78
[52] U.S. Cl. .................. 307/221 D; 357/24
[58] Field of Search .................. 357/24; 307/221 D

[56] References Cited

U.S. PATENT DOCUMENTS

| 4,035,667 | 7/1977 | Heller | 357/24 |
|---|---|---|---|
| 4,047,051 | 9/1977 | Heller | 357/24 |
| 4,104,543 | 8/1978 | Maeding | 357/24 |

OTHER PUBLICATIONS

Critchlow et al., "Magnitude Differencing Circuit" IBM Technical Disclosure Bulletin vol. 18 (2/76) p. 3071–3072.

Primary Examiner—Gene M. Munson
Attorney, Agent, or Firm—John J. Goodwin

[57] ABSTRACT

A circuit is disclosed for obtaining a quantity of electrical charge carriers equal to and representative of the algebraic difference between the values of two original quantities of electrical charge carriers. The circuit includes two charge coupled device input shift registers. Each of the two shift registers incorporates at least three potential well electrodes and interposed transfer electrodes such that charge packets can be shifted from well to well. One potential well in each of the two shift registers is operated in a floating gate electrode mode, and the two potential wells are connected at a common node which services as the input to a third or output charge coupled device shift register. The two original quantities of electrical charge carriers are represented respectively in each of the two input shift registers by a pair of spatially separated charge packets which when sensed by sequencing them into and out of the potential well under the floating gate electrode provide the algebraic value of the associated quantity of electrical charge carriers. By representing each original charge quantity by two spatially separated pairs of charge packets, positive and negative algebraic values may be representing even though all the charge quantities are made up of charge carriers of the same polarity. Combining the two floating gate electrodes at the common node rectifying input to the third or output shift register produces an algebraic value in the output shift register which represents the difference between the original charge packets.

7 Claims, 6 Drawing Figures

NON-DESTRUCTIVE CHARGE TRANSFER DEVICE DIFFERENCING CIRCUIT

DESCRIPTION

1. Technical Field

The present invention relates to a circuit for subtracting, or obtaining a signal proportional to the difference between two quantities of charge of the same polarity, and more particularly to a change quantity differencing circuit including first and second charge transfer device input shift registers combined at a common node to the input of a third charge transfer device output shift register.

2. Background Art

Techniques for obtaining a representation of the difference between charge quantities are known in the prior art and normally require the charge quantities to be converted to corresponding voltages so that subtraction can be performed. One class of prior art circuits include two capacitors wherein the two quantities of charge are stored in separate capacitors and are thereby converted into two corresponding voltages, one of which is then subtracted from the other. An example of a circuit of this type is described in the publication "Magnitude Differencing Circuit," by D. L. Critchlow et al, in the IBM Technical Disclosure Bulletin, Vol. 18, No. 9, February 1976 at page 3071.

Two capacitor circuits exhibit the undesirable feature that the two capacitors may have inherently different characteristics which effect the charge stored thereon, and when the two resultant voltages are subtracted the effect of the characteristic differences is included in the difference voltage as a distortion and poses a limit on the accuracy of the circuit.

Another prior art technique which is distinct from the two-capacitor device approach but which also requires a conversion from charge quantity to voltage is described in U.S. Pat. application, Ser. No. 785,723, filed Apr. 7, 1977, by L. G. Heller et al, entitled "Charge Transfer Device Differencing Circuit". This structure is embodied with a single time-shared floating gate capacitor to produce the representative output voltage. Since both charge quantities are sequentially placed on the same capacitor to produce the two representative voltages there is no tracking error which might arise if the charge quantities were placed on two separate capacitors.

U.S. Pat. No. 4,104,543 entitled "Multichannel CCD Signal Subtraction System" issued Aug. 1, 1978 to Maeding et al on an application filed Feb. 22, 1977 and assigned to Hughes Aircraft Company describes a multichannel CCD structure which likewise produces a voltage representative of the desired accummulated differences of the charges contained in the multichannel structure.

Another example of a floating gate in a charge-coupled device environment is shown in U.S. Pat. No. 3,623,132, issued Nov. 23, 1971, to R. D. Green on an application filed Dec. 14, 1970, and assigned to North American Rockwell Corporation. This patent is cited as being of general background interest and does not relate to charge differencing.

The subject invention is distinct over the prior art in that the difference between the input charge packets is represented by an output charge packet instead of being converted to an output voltage. This is accomplished by the unique structure and technique wherein each input charge packet is represented first by a separate pair of spatially separate charge packets to represent positive and negative algebraic values using charge carriers of the same polarity, and wherein the pairs of charge packets are processed to the representative output charge packet.

DISCLOSURE OF THE INVENTION

In charge transfer device technology involving charge coupled devices and bucket brigade devices, information is represented and manifested in quantities or packets of charge of different amounts but having the same polarity. To perform the summation function in charge transfer devices is straightforward: charge packet Qa is entered into a potential well and charge packet Qb is entered into the same well. The charge carriers in the two packets combine and the resultant charge Qc in the well is equal to Qa+Qb. The difference function, that is, the subtraction of one charge packet from another is more difficult to achieve. Heretofore, there has been no way in which one charge packet could be directly subtracted from another charge packet of the same polarity to produce a third (difference) charge packet. The usual prior art approach is to convert the charge packet values to voltages on either two or a single capacitor and the resultant voltages are then subtracted. Such conversion to a voltage is undesirable, particularly when the charge transfer circuit is embodied on a semiconductor chip and when further on-chip processing of the difference function is desired and it is necessary to maintain the difference signal in charge form.

Figure 1:
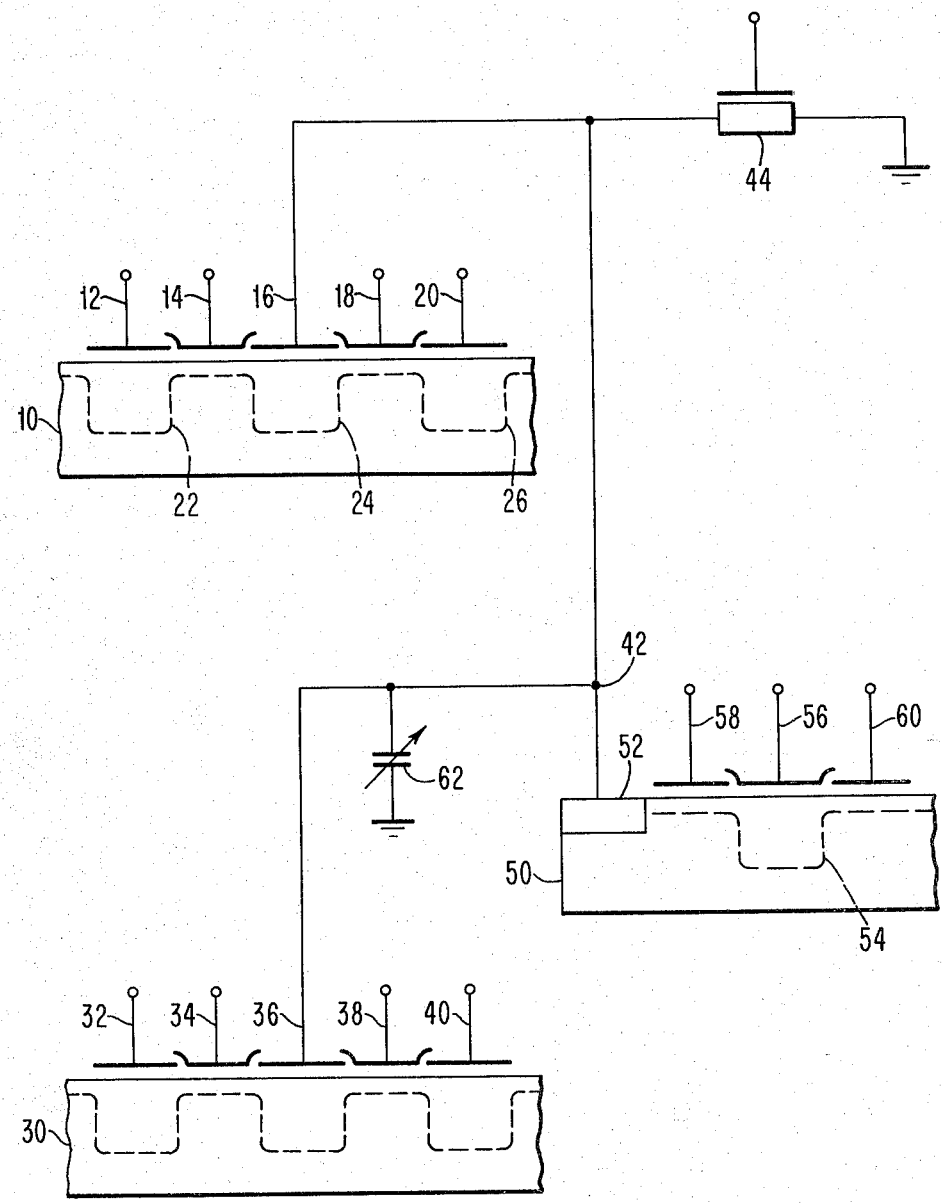
FIG. 1 is a schematic illustration of an embodiment of a charge differencing circuit including two charge coupled device input shift registers coupled through floating gate electrodes and a common node to an output charge coupled device shift register.

Referring to FIG. 1 of the drawings, an embodiment of a circuit is shown wherein the charge differencing function is performed while maintaining the difference quantity in charge form as a resultant charge packet, and in addition the original charge packets which are subtracted are not destroyed in the processing. In charge coupled devices, the packets consist of charge carriers of one type. Thus, in n-channel devices the charge packets are electrons (−) only, and in p-channel devices the charge packets are holes (+). There is no simple way of representing both positive and negative quantities in a given charge packet. This is the reason that heretofore the quantities had to be converted to positive and negative voltages so that differencing or subtraction could be performed. In the present invention, as illustrated in FIG. 1 of the drawings, an algebraic value is designated spatially rather than by polarity. Considering an n-channel device, an algebraic value of a given charge quantity is spatially designated as the difference in the number of electrons in each of a pair of charge packets in two separate potential wells. Thus, a charge quantity having a value of "five" and positive polarity is represented by a pair of charge packets consisting, for example, of a first packet (the algebraically "positive" component) having a value of "eight" and located in a first well and a second packet (the algebraically "negative" component) having a value of "three" and located in a second well. Both components of the pair are electrically "negative", being composed of packets of electrons, however the packet in the first well is defined as the algebraically positive component and the packet in the second well is defined as the algebraically negative component. The difference in value between "eight" and "three" is the value ("five") of the original charge quantity, and since the packet in the first well is the larger component, the value of the original charge quantity is "positive five". If the value in the first well were "three" and the value in the second well were "eight", this would represent an original charge packet of "negative five". The first, or algebraically positive component of an original charge quantity Qa will be hereinafter designated $|Qa^+|$ and the algebraically negative component will be designated $|Qa^-|$. For example, if $|Qa^+|$ is the amount of charge in the first well of a pair, and $|Qa^-|$ is the amount of charge in the other well of the pair, then the algebraic value of the pair of charge packets is defined as $$Qa = |Qa^+| - |Qa^-|$$

and likewise $$Qb = |Qb^+| - |Qb^-|$$

Thus a sequence of algebraic values may be represented as two adjacent shift registers filled with charge packet pairs (parallel case) or alternatively the algebraic values may be stored in paired (serial) sequence in one shift register twice as long as those in the parallel mode. The serial representation or mode using one charge coupled shift register for each input charge packet in the subtraction will be employed in the present embodiment and description.

Taking the algebraic difference $Qc = Qa - Qb$ requires the following function or operation to be performed on the pairs of charges.

$$Qc = |Qc^+| - |Qc^-| \text{ which is the same as} \quad (1)$$

$$Qc = [|Qa^+| - |Qa^-|] - [|Qb^+| - |Qb^-|] \text{ or} \quad (2)$$

$$Qc = [|Qa^+| + |Qb^-|] - [|Qa^-| Qb^+|] \quad (3)$$

Comparing equations (1) and (3) it is seen that Qc could be represented by $$|Qc^+| = [|Qa^+| + |Qb^-|] \text{ and} \quad (4)$$

$$|Qc^-| = [|Qa^-| + [Qb^+|] \quad (5)$$

Thus by selectively summing the component parts of Qa and Qb, the difference value Qc could be represented. However, if the sum $|Qa^+| + |Qb^-|$ representing $|Qc^+|$ and the sum $|Qa^-| + |Qb^+|$ representing $|Qc^-|$ both become large, the storage means required to hold these summed charges will be undesirably large and if the difference $Qc = |Qc^+| - |Qc^-|$ is small compared to the large values of $|Qc^+|$ and $|Qc^-|$ such difference becomes difficult to detect with accuracy. Preferably, the differencing process is designed so that either $|Qc^+|$ or $|Qc^-|$ is equal to zero so that $$Qc = |Qc^+| - O \text{ for } Qc \geq 0 \text{ or} \quad (6)$$

$$Qc = O - |Qc^-| \text{ for } Qc \leq 0. \quad (7)$$

The embodiment of the invention illustrated in the drawing provides the differencing function with this preferable result. A first conventional charge coupled device shift register 10 includes electrodes 12, 14, 16, 18 and 20. A second conventional charge coupled shift register 30 includes electrodes 32, 34, 36, 38 and 40. Shift register 10 handles charge packets $|Qa^+|$ and $|Qa^-|$ and shift register 30 handles charge packets $|Qb^+|$ and $|Qb^-|$. The value Qb will be subtracted from the value Qa. In a conventional charge coupled device technology manner, a potential well 22 is created by a voltage on electrode 12, a potential well 24 is created by a voltage on electrode 16 and a potential well 26 is created by a voltage on electrode 20. Clock signals applied to electrodes 14 and 18 enable charge packets to be shifted into and out of the potential wells in a conventional manner. The bias and clock voltage sources applied to electrodes 12, 14, 16, 18 and 20 are not illustrated since the generation of a charge transfer shift register is so well known in the art. A very complete explanation of charge coupled device structure and operation principles including charge shifting between potential wells is described in the text Charge Transfer Devices by Carlo H. Sequin and Michael F. Tompsett, published by Academic Press, N.Y., July 1975.

In the particular embodiment of FIG. 1, shift register 10 will store and handle charge packets $|Qa^+|$ and $|Qa^-|$ derived from input charge quantity Qa and shift register 30 will store and handle charge packets $|Qb^+|$ and $|Qb^-|$ derived from input charge quantity Qb. Thus, the embodiment of FIG. 1 presupposes a means and technique for providing the component pairs $|Qa^+|$ and $|Qa^-|$ from the original charge quantity Qa and the component pairs $|Qb^+|$ and $|Qb^-|$ from charge quantity Qb. There are many ways of obtaining spatially separated charge packets such as $|Qa^+|$ and $|Qa^-|$ from an original charge quantity Qa. For example, a typical application of the charge differencing circuit of the present invention may be a sequence of signal processing operations on algebraic values derived from the output of a CCD split-electrode transversal filter of the type described by Brodersen et al in the publication "A 500-Stage CCD Transversal Filter for Spectral Analysis", *IEEE Transactions on Electron Devices*, Feb. 1976, pp. 143-152. Such typical split-electrode filter configuration, shown in FIG. 3, includes two phase four ($\phi_4$) clock lines. These clock lines are a sequence of gate electrodes connected in common. The clock lines $\phi_4^+$ and $\phi_4^-$ are connected respectively to the "positive" and "negative" sides of the split electrodes. The charge which occurs under the "positive" parts of the split electrodes are considered as $|Qa^+|$ and the charge which occurs under the "negative" part of the split electrodes are considered as $|Qa^-|$.

Figure 3:
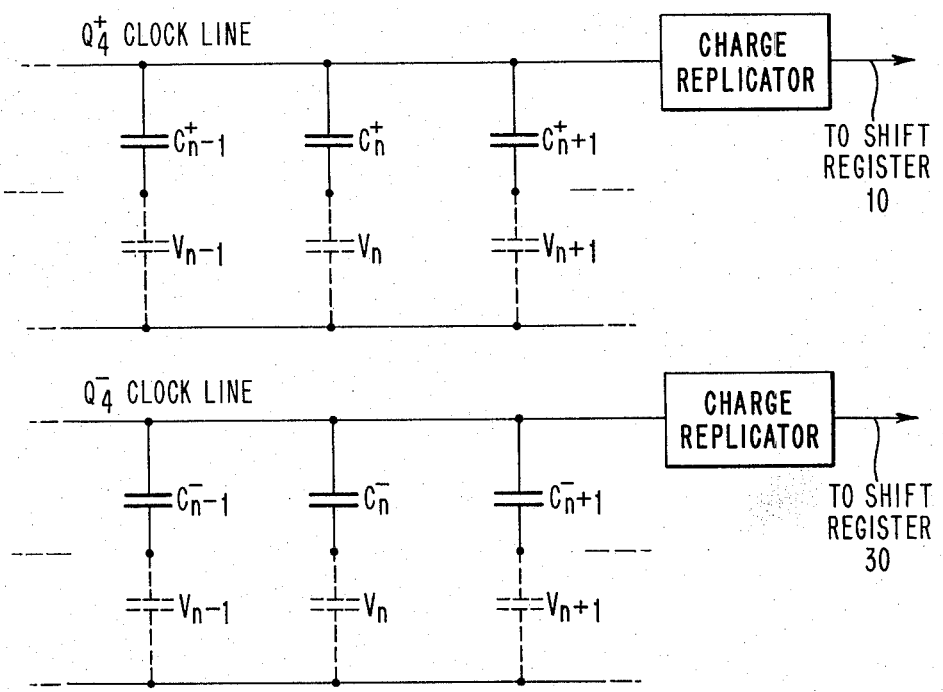
FIG. 3 is a schematic illustration of a prior art technique for introducing charge packets into the structure illustrated in FIG. 1.

Instead of connecting the $\phi_4^+$ and $\phi_4^-$ clock lines to a voltage differencing amplifier as shown in FIG. 4 of the Brodersen et al publication, the clock can be individually connected to respective charge replication circuits such as shown and described in U.S. Pat. No. 4,047,051 entitled "Method and Apparatus for Replicating a Charge Packet" issued Sept. 6, 1977 to L. G. Heller and assigned to the International Business Machines Corporation. The combination of the split-electrode filter and the charge replicator circuit are shown in FIG. 3. Thus, with the combination of the split-electrode filter and the two charge replicator circuits, as charge is moved into the potential well under the "positive" split electrodes, a charge $|Qa+|$ will be replicated into an output well of the corresponding replicator. Similarly, as charge is moved into the potential well under the "negative" split electrodes, a charge $|Qa-|$ will be replicated into an output well of that replicator. Thus, two charge packets are created, $|Qa+|$ and $|Qa-|$, in wells which are designated (spatially) to contain the "positive" and "negative" components of the transversal filter output Qa. This pair of charge packets $|Qa+|$ and $|Qa-|$ are then shifted or transferred into shift register 10 of FIG. 1.

In like manner a second transversal filter handles charge quantity Qb and provides two spatial pairs of charge packets $|Qb+|$ and $|Qb-|$ at the split electrodes thereof which, in combination with two further charge replicator circuits, shifts a pair of spatial charge packet pairs $|Qb+|$ and $|Qb-|$ into shift register 30 shown in FIG. 1. This is one example of how the two charge quantities to be differenced, Qa and Qb, are formed into two pairs of spatially separated charge packets $|Qa+|$, $|Qa-|$ and $|Qb+|$, $|Qb-|$ in shift registers 10 and 30.

Electrode 16 of shift register 10 and electrode 36 of shift register 30 are connected to a common source node 42. A field effect transistor 44 is connected between source node 42 and ground potential and functions as a switch. Source node 42 is also connected to the input diode 52 of an output shift register. Input 52 of shift register 50 is an n diffusion in the p-silicon substrate of the shift register 50. Charge is transferred into potential well 54 of shift register 50 by operation of input diode 52 and the potential on node 42 in a manner similar to but not identical to the technique described in the publication by Tompsett et al., "Use of Charge-Coupled Devices for Delaying Analog Signals," *IEEE J. Solid State Circuits*, Vol. Sc-8, (Apr. 1973), pp. 151–157. Potential well 54 is created by signal on electrode 56 and charge packets are transferred into and out of potential well 54 by transfer electrodes 58 and 60. Capacitor 62 shown connected to source node 42 represents the circuit loading capacitance $C_L$.

The manner in which the embodiment of FIG. 2, resulting in a difference value charge quantity being generated in potential well 54 is as follows:

With no charge in the potential wells under electrodes 16 and 36 of shift registers 10 and 30, the field effect transistor 44 is gated "on", which applies the "ground" potential to electrodes 16 and 36, node 42 and diffusion 52 of shift register 50. Field effect transistor 44 is then gated "off", which leaves node 42 and points connected thereto "floating". Gate 58 of shift register 50 is biased to some intermediate reference voltage $V_x+V_{th}$. $V_{th}$ is the threshold voltage drop associated with that gate and $V_x$ is some voltage between "ground" and the maximum clocking voltage applied to the shift register 50. $V_x$ might typically be near the midpoint of the maximum voltage and "ground".

In the next step of operation, excess charge is pulled out of diffusion 52 through the gate 58 channel and into adjacent potential well 54. Potential well 54 may be kept "empty" in a known manner by an adjacent gate and diffusion (not shown). Such adjacent gate and diffusion are shown in U.S. Pat. No. 4,035,667 entitled "Input Circuit for Inserting Charge Packets Into a Charge-Transfer Device," issued July 12, 1977 to L. G. Heller and assigned to the International Business Machines Corporation. The gate and the diffusion are indicated in that patent by $\phi d$ (26) and Vd (24), respectively.

By the means described in the previous paragraph, the diffusion 52 and associated floating points 16, 36, and 42 will be pulled to a voltage level $V_x$, thereby creating empty potential wells under electrodes 16 and 36 of shift registers 10 and 30. Charge packet $|Qa-|$ can then be shifted into the potential well under gate 16 and charge packet $|Qb+|$ can be shifted into the well under gate 36. During this shifting operation, diffusion 52 is maintained at voltage $V_x$ by the voltage $V_x+V_{th}$ applied to gate 52 of shift register 50 and by the maintenance of the empty well 54 by the adjacent gate and diffusion which are not shown.

Instead of connecting field effect transistor 44 to "ground," it can be connected to a voltage close to but less than $V_x$. This will maintain a well under gate 16 and 36 at all times so that charges $|Qa-|$ and $|Qb+|$ can already be in the respective wells during the set-up operation described in the above steps.

The next part of the operation begins with empty potential well 54 being isolated from adjacent diffusion (not shown) by putting the adjacent gate (not shown) in the "off" mode; e.g., by setting $\phi d$ (shown in aforesaid U.S. Pat. No. 4,035,667) to "ground".

Charge packets $|Qa-|$ and $|Qb+|$ are then pulled out of potential wells under respective electrodes 16 and 36. This may be accomplished by applying a voltage significantly greater than $V_x$ to electrodes 20 and 40 and subsequently gating electrodes 18 and 38 "on" and "off". This step of the operation causes the floating potential on node 42 to increase as indicated by arrows $|Qa-|$ and $|Qb+|$ in FIGS. 2a and 2b.

Assuming that charges $|Qa+|$ and $|Qb-|$ have been clocked into potential wells under gate 12 and 32 respectively, then these charges can be transferred to the potential wells under gates 16 and 36 respectively by gating 14 and 34 high or "on," returning 12 and 32 to "ground," and then gating 14 and 34 low or "off". This step produces the voltage changes indicated by arrows $|Qa+|$ and $|Qb-|$ in FIGS. 2a and 2b.

Figure 2A:
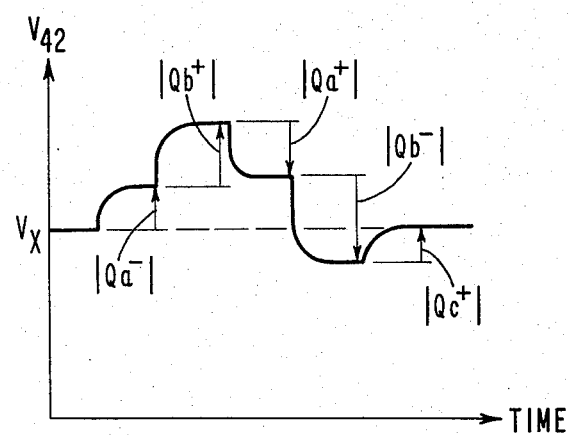
FIGS. 2A through 2D are illustrations of waveforms useful in describing the operation of the circuit of FIG. 1.
Figure 2B:
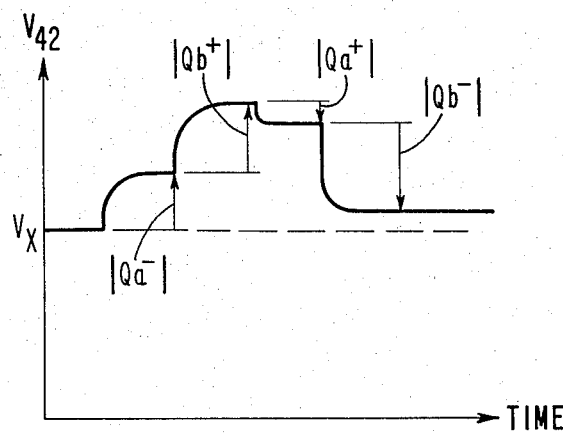

If, as shown in FIG. 2a, the voltage on node 42 goes below the level $V_x$, then an amount of charge $|Qc+|$ will flow from diffusion 52 into well 54 and the voltage level on node 42 will return to the original value $V_x$. The return of the node voltage back to the initial value $V_x$ insures the elimination of non-linearity errors due to loading capacitor 62. If $Qc \leq 0$, then no charge wil flow due to the rectifying nature of diffusion 52 and the channel under gate 58.

Figure 2C:
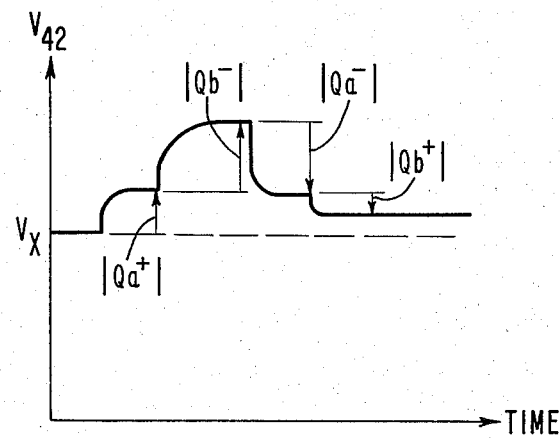
Figure 2D:
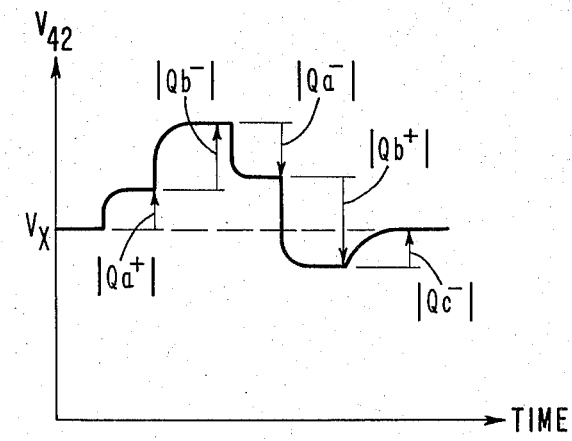

At this point, an amount of charge $|Qc+|$ has been generated in well 54 if $Qc \geq 0$; no charge is generated if $Qc \leq 0$. The charge in well 54 is then shifted to a location designating $|Qc+|$ and the process is then repeated in order to generate $|Qc-|$ in well 54 by setting the voltage on node 42 to $V_x$, pulling charge packets $|Qa+|$ and $|Qb-|$ out of wells under gates 16 and 36 respectively, shifting charge packets $|Qa-|$ and $|Qb+|$ into the respective wells of gates 16 and 36, causing node 42 voltage to change as indicated in FIG. 2c for $Qc \geq 0$, or as indicated in FIG. 2d for $Qc \geq 0$, or as indicated in FIG. 2d for $Qc \leq 0$.

Once $|Qc-|$ has been so generated, it is shifted into a location designating the negative component of Qc. Thus, the difference operation is completed, and the value of $Qa-Qb=Qc=|Qc+|-|Qc-|$ has been generated with either $|Qc^+|=0$ or $|Qc^-|=0$ as was desired.

It should be understood that although a two channel structure is described in FIG. 1, a three or more channel device can be constructed by one skilled in the art using the teachings of the present invention.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A charge transfer device differencing circuit for producing a quantity Qc of electrical charge carriers equal to and representative of the algebraic difference between the values of two original quantities of electrical charge carriers Qa and Qb comprising means for producing a first pair of discrete charge packets $|Qa^+|$ and $|Qa^-|$ representative of said charge quantity Qa and a second pair of discrete charge packets $|Qb^+|$ and $|Qb^-|$ representative of said charge quantity Qb, first and second charge transfer shift registers having outputs connected to a common node and responsive respectively to said first and second pairs of discrete charge packets for producing voltage changes on said common node representative respectively of the combination of charge packets $|Qa^-|$, $|Qb^+|$, $|Qa^+|$ and $|Qb^-|$, said first and second charge transfer device shift registers each including a semiconductor substrate for sustaining a plurality of potential wells for containing electrical charge carriers and electrodes proximate said substrate for shifting quantities of electrical charge carriers into and out of said potential wells, one of said electrodes of said first shift register and a corresponding one of said electrodes of said second shift register being connected at said common node, and a third charge transfer shift register connected to said first and second shift registers at said common node and responsive to said voltage changes on said common node for producing a first charge packet quantity $|Qc^+|$ and a second charge packet $|Qc^-|$, wherein said charge packets $|Qc^+|$ and $|Qc^-|$ are representative of a value Qc which is equal to the algebraic difference value Qa-Qb, said third charge transfer shift register including a semiconductor substrate for sustaining at least one potential well for containing charge carriers, a plurality of electrodes proximate said substrate for shifting charge carriers into and out of said at least one potential well, and an input diffusion region in said substrate connected to said common node for producing charge carriers in response to potential levels on said common node, and therein said means for producing said first pair of discrete charge packets designated $|Qa^+|$ and $|Qa^-|$ representative of said first charge quantity designated Qa, and said second pair of discrete charge packets designated $|Qb^+|$ and $|Qb^-|$ representative of said second charge quantity designated Qb includes means for shifting charge packet $|Qa^-|$ and charge packet $|Qb^+|$ respectively into and out of said potential wells proximate said one of said electrodes of said first shift registers connected to said common node and said corresponding one of said electrodes of said second shift register connected to said common node wherein shifting charge packets $|Qa^-|$ and $|Qb^+|$ out of said respective potential wells produces a first voltage level change on said common node, said means for shifting thereafter shifting said charge packets $|Qa^+|$ and $|Qb^-|$ into said same respective potential wells to produce a second voltage level change on said common node, said resulting voltage value on said common node interacting with said input diffusion causing a corresponding first charge packet $|Qc^+|$ to be produced in said third shift register, and wherein shifting said charge packets $|Qa^+|$ and $|Qb^-|$ out of said same respective potential wells produces a third voltage level change on said common node, said means for shifting thereafter shifting said charge packets $|Qa^-|$ and $|Qb^+|$ into said same respective potential wells to produce a fourth voltage level change on said common node, said resulting voltage value on said common node interacting with said input diffusion causing a second charge packet $|Qc^-|$ to be produced in said third shift register, and wherein said charge packets $|Qc^+|$ and $|Qc^-|$ in said third shift register is equal to and representative of said algebraic difference value Qa−Qb.

2. A charge transfer differencing circuit according to claim 1 wherein the value for one of said first and second charge packets $|Qc^+|$ and $|Qc^-|$ is zero and the other of said first and second charge packets $|Qc^+|$ and $|Qc^-|$ is representative and equal to the algebraic difference value Qa−Qb.

3. A charge transfer differencing circuit according to claim 1 wherein the value for one of said first and second charge packets $|Qc^+|$ and $|Qc^-|$ is zero and the other of said first and second charge packets $|Qc^+|$ and $|Qc^-|$ is representative and equal to the algebraic difference value Qa−Qb.

4. A charge transfer device differencing circuit according to claim 1 further including a switching device connected to a potential source and to said common node, said switching device being responsive to a switching signal for applying a potential level to said common node and to said electrodes of said first and second shift registers and said diffusion of said third shift register connected thereto.

5. A charge transfer device differencing circuit according to claim 4 wherein said switching device operates to apply a bias voltage onto said common node, wherein shifting said charge packets $|Qa^-|$ and $|Qb^+|$ out of said potential wells proximate said electrodes of said first and second shift registers connected to said common node produces a first voltage change in said bias voltage on said common node, and shifting said charge packets $|Qa^+|$ and $|Qb^-|$ into said potential wells produces a second voltage change in said bias voltage on said common node, said resultant voltage on said common node after said first and second voltage changes causing a first voltage change on said input diffusion of said third shift register interacting with said input diffusion to produce said corresponding charge packet $|Qc^+|$, and wherein shifting said charge packets $|Qa^+|$ and $|Qb^-|$ out of said potential wells proximate to said electrodes of said first and second shift registers connected to said common node produces a third voltage change in said bias voltage on said come node and shifting said charge packets $|Qa^-|$ and $|Qb^+|$ into said potential wells produces a fourth voltage change in said bias voltage on said common node, said resultant voltage on said common node, said resulting voltage on said common node after said third and fourth voltage changes causing a second voltage change on said input diffusion of said third shift register interacting with said input diffusion to produce said corresponding charge packet $|Qc^-|$.

6. A charge transfer device differencing circuit according to claim 5 wherein said means for producing said charge packet pairs $|Qa^+|$, $|Qa^-|$ and $|Qb^+|$, $|Qb^-|$ include first and second split electrode transversal filter circuits response respectively to charge quantities Qa and Qb, and first and second charge replication circuits connected to the outputs of said split electrode transversal filter circuits.

7. A charge transfer differencing circuit according to claim 5 wherein the value for one of said first and second charge packets $-Qc^+|$ and $|Qc^-|$ is zero and the other of said first and second charge packets $|Qc^+|$ and $|Qc^-|$ is representative and equal to the algebraic difference value Qa−Ob.

* * * * *